US005909038A

United States Patent [19]

Hwang et al.

[11] Patent Number: 5,909,038

[45] Date of Patent: Jun. 1, 1999

[54] SYNTHETIC METHOD OF SOLUBLE PPV DERIVATIVES HAVING TWO SILYL GROUPS AND LIGHT-EMITTING DEVICES USING THE SAME

[75] Inventors: Do Hoon Hwang; Sang Don Jung; Lee Mi Do; Tae Hyoung Zyung, all of Daejon-shi; Hyang Mok Lee, Seoul-shi; Kang Hoon Choi, Daejon-shi, all of Rep. of Korea

[73] Assignee: Electronics and Telecommunications Research Institute, Daejon Shi, Rep. of Korea

[21] Appl. No.: 09/141,552

[22] Filed: Aug. 28, 1998

[30] Foreign Application Priority Data

Sep. 29, 1997 [KR] Rep. of Korea ...................... 97-49804

[51] Int. Cl.[6] ........................... H01L 33/00; H01L 35/24; H01L 51/00

[52] U.S. Cl. .............................. 257/103; 257/40; 257/94; 257/96

[58] Field of Search ....................................... 257/40, 103

[56] References Cited

U.S. PATENT DOCUMENTS 5,011,944 4/1991 Kvita et al. ............................ 549/214

5,247,190 9/1993 Friend et al. .

OTHER PUBLICATIONS

Do–Hoon Hwang et al., Green light–emitting diodes from poly(2–dimethyloctylsilyl–1,4–phenylenevinylene), Chem. Commun., 1996, pp. 2241–2242, 1996.

J. H. Burroughes et al., “Light–emitting diodes based on conjugated polymers”, Letters to Nature, pp. 539–541.

Do–Hoon Hwang et al., Green light–emitting diodes from poly(2–dimethyloctylsilyl–1,4–phenylenevinylene), Chem. Commun., 1996, pp. 2241–2242.

*Primary Examiner*—Jerome Jackson, Jr.
*Assistant Examiner*—Bradley William Baumeister
*Attorney, Agent, or Firm*—Jacobson, Price, Holman & Stern, PLLC

[57] ABSTRACT

There is disclosed a syntheitc method of mixing a soluble poly(1,4-phenylenvinylene)(PPV) derivative in which two silyl groups are substituted, and an electroluminescent device using the same. In the poly[2,5-bis (dimethyloctylsilyl)-1,4-phenylenvinylene] (BDMOS-PPV) according to the present invention, the final polymer is easily dissolved in common organic solvents and shows a measured absolute PL quantum efficiency of 60% much higher than that of the conventional PPV having 25%, thus making it possible to be applied as material of an electroluminnescent device. Also, it provides an outstanding advantage that it can be applied to a flexible light-emitting device.

2 Claims, 2 Drawing Sheets

SYNTHETIC METHOD OF SOLUBLE PPV DERIVATIVES HAVING TWO SILYL GROUPS AND LIGHT-EMITTING DEVICES USING THE SAME

BACKGROUND OF THE INVENTION

1. Field of the Invention

The present invention relates to a synthetic method of soluble green-color light-emitting PPV derivative and electroluminescent devices.

2. Description of the Prior Art

PPV and its derivatives have been popularly used as emissive materials for light-emitting devices until now. Generally, PPV is synthesized through a water-soluble precursor polymer which is soluble in water or methanol, or precursor polymers which are soluble in organic solvents. Through a heat treatment process at more than 200° C., it is finally converted to the fully conjugated form after the leaving groups are removed from it. This heat treatment process has many problems during the process, and also has disadvantage that it could not be applied to a flexible plastic substrate since it must experience a high temperature heat treatment process. Therefore, until now, several PPV derivatives which do not require the above heat treatment process and can be also dissolved in organic solvents have been synthesized, so that they are used as materials for light-emitting devices. However, several PPV derivatives which have been known until now include mainly derivatives which emit light of a red-yellow color type in which alkoxy group such as MEH-PPV is substituted therefor.

SUMMARY OF THE INVENTION

It is an object of the present invention to solve the problems involved in the prior art, and to provide a synthetic method of a new PPV derivative which is soluble in organic solvents while emitting a green light such as PPV and electroluminescent devices using the same.

To achieve the above object, the synthetic method of a poly[2,5-bis (dimethyloctylsilyl)-1,4-phenylenvinylene] (BDMOS-PPV) according to the present invention is characterized in that it comprises the steps of obtaining a 2,5-bis(dimethyloctyl)-para-xylene through a Grignard reaction to said compound 2,5-dibromo-para-xylene; obtaining a 2,5-bis(dimethyloctyl)-1,4-bis(bromomethyl)benzene through a NBS reaction to said 2,5-bis (dimethyloctyl)-para-xylene; and obtaining a poly[2,5-bis (dimethyloctylsilyl)-1, 4-phenylenvinylene] through a dehydrohalogenation reaction to said 2,5-bis(dimethylictyl)-1,4-bis(bromomethyl) benzene.

To achieve the above object, the present invention provides an eletorluminescent device in which a semitransparent electrode, a hole transporting layer, a high-polymer light-emitting layer, an electron transporting layer and a metal electrode are sequentially formed on a substrate, wherein said polymer light-emitting layer is consisted of a poly[2,5-bis (dimethyloctylsilyl)-1,4-phenylenvinylene].

According to the present invention, two silyl groups having alkyl group are introduced into PPV. Since the electronic effect of silyl group is almost the same as that of hydrogen, the synthesized polymer has an almost same Homo-Lumo bandgap and electro-optical characteristics as PPV. Though PPV can be manufactured by various manufacturing methods, silyl-disubstituted PPV is synthesized through dehydrohalogenation reaction. The soluble PPV has an advantage that it can be easily manufactured and also can be applied to a flexible light emitting device.

BRIEF DESCRIPTION OF THE DRAWINGS

The above object, and other features and advantages of the present invention will become more apparent by describing the preferred embodiment thereof with reference to the accompanying drawings, in which.

Similar reference characters refer to similar parts in the several views of the drawings.

DETAILED DESCRIPTION OF PREFERRED EMBODIMENT

Figure 1:
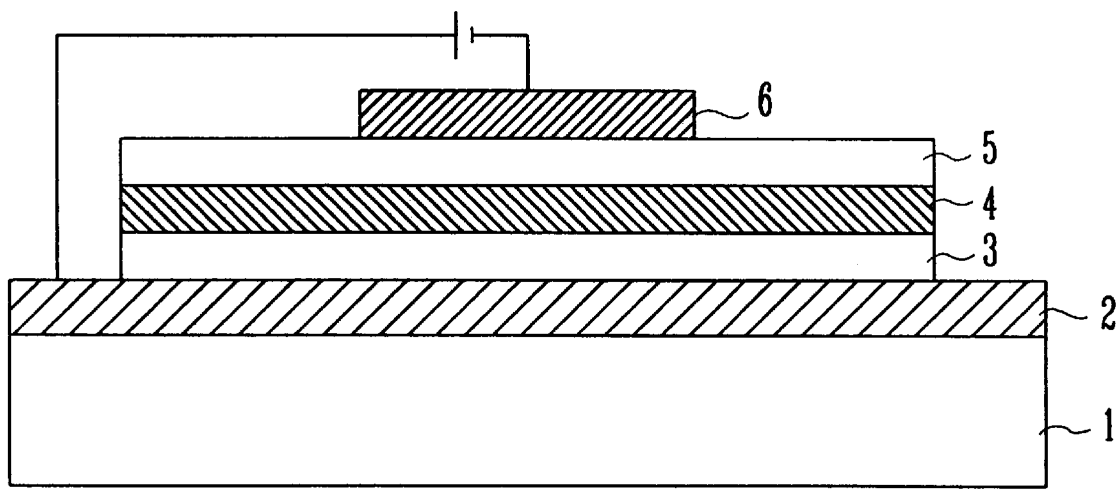
FIG. 1 shows a sectional view of an eletroluminescent (EL) device using PPV derivatives in which two silyl groups are substituted.

The preferred embodiment of the present invention will be explained in detail below by reference to the accompanying drawings.

First, the synthetic method of poly[2,5-bis (dimethyloctylsilyl)-1,4-phenylenvinylene] (BDMOS-PPV) which is a PPV derivative in which dimethyloctylsilyl group is substituted used as a light-emitting material of the present invention, will be explained as follows.

[chemical formula 1]

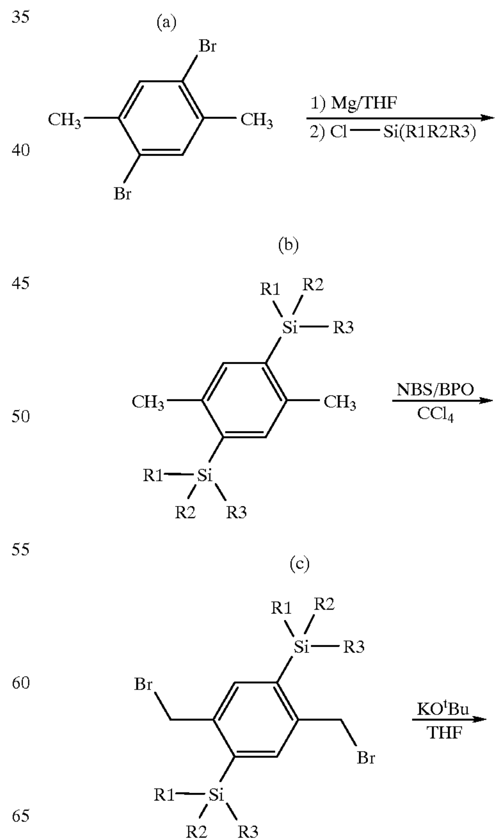

-continued

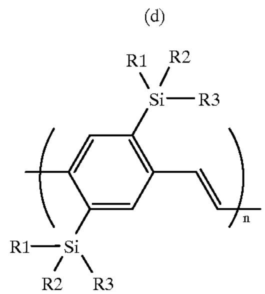

A 2,5-bis(dimethyloctylsilyl)-para-xylene(chemical formula 1b) is obtained through a Grignard reaction to said compound 2,5-dibromo-para-xylene (chemical formula 1a), a 2,5-bis(dimethyloctylsilyl)-1,4-bis(bromomethyl) benzene (chemical formula 1c) is obtained through a NBS reaction to said 2,5-bis(dimethyloctylsilyl)-para-xylene(chemical formula 1b), and a poly[2,5-bis (dimethyloctylsilyl)-1,4-phenylenvinylene](chemical formula 1d) is obtained through a dehydrohalogenation polycondensation reaction to said 2,5-bis(dimethyloctylsilyl)-1,4-bis(bromomethyl) benzene(chemical formula 1c) is obtained.

A composite of the PPV inductor in which the two silyl groups are substituted will be further explained.

(1) Synthesis of 2,5-bis(dimethyloctyl)-para-xylene (chemical formula 1b)

A 2,5-dibromo-para-xylene(chemical formula 1a) of 10 g (37.9 mmol) in which anhydrous of THF 20 ml is dissolved in a clean magnesium piece of 3.7 g(151.6 mmol) is slowly heated to produce a Grignard reagent. When magnesium is completely dissolved, chlorodimethyloctylsilane of 17.2 (83.4 mmol) is added thereto, thus causing them to react together at 70° C. for 3 hours. Then, a diluted hydrochloric acid solution is added so that the reaction can be finished, thus extracting diethyether therefrom. The extracted organic layer is vacuum-distilled to obtain a desired product of 6.8 g (40%).

b.p. 180° C./0.2 mmHg.

$^1$H-NMR ($CDCl_3$, 200 MHz): δ7.20 (2H, s), 2.41 (6H, s), 2.34 (3H, s), 1.45–1.15 (24H, m), 0.97–0.75 (10H, m), 0.29 (12H, s)

Element analysis [measurement value C: 74.89, H: 12.01, theory value C: 75.25, H: 12.18%]

(2) Synthesis of 2,5-bis(dimethyloctylsilyl)-1,4-bis (bromomethyl) benzene (chemical formula 1c)

Anhydrous 40 ml of $CCl_4$ is added to the product (chemical formula 1b) of 4 g (9.0 mmol) and NBS of 3.2 g (17.9 mmol), they are circulated for 3 hours. After reaction, is removed using a filtering paper. Then, aqueous residue from which solvent of the remaining solution is distilled, is separated into a desired product using a column chromatography. Non-color oil of 2.4 g (45%) is obtained therefrom.

$^1$H-NMR ($CDCl_3$, 200 MHz):δ7.48 (2H, s), 4.56 (4H, s), 1.35–1.15 (24H, m), 0.90–0.70 (10H, m), 0.36 (12H, s)

Element analysis [measurement value C: 55.12, H: 8.58, theory value C: 55.62, H: 8.67%]

(3) Synthesis of poly[2,5-bis (dimethyloctylsilyl)-1,4-phenylenvinylene] (BDMOS-PPV) (chemical formula 1d)

The 1.6 g of clean monomer (2.65 mmol) (chemical formula 1c) is dissolved in 20 ml of anhydrous THF and then flowed with nitrogen for 5 minutes, thus removing oxygen therefrom. Meanwhile, $KO^tBu$ 1.7 g (15.9 mmol) is dissolved in anhydrous THF of 20 ml and then flowed with nitrogen for 5 minutes, thus removing oxygen therefrom. At room temperature, $KO^tBu$ are added in a monomer solution for 20 minutes drop by drop. With time, as the color of the solution tints a right green, its viscosity is increasing increased. At room temperature, the solution is reacted for about 20 hours, it is slowly precipitated in 500 ml of methanol. After the precipitated polymer is filtered and then dried, it is dissolved in a minimum of THF and then precipitated again in methanol to remove ionic impurities and low molecular weight oligomers, thus producing the 0.8 g(68%) of desired product.

Element analysis [measurement value C: 77.69, H: 11.12, theory value C: 75.94, H: 11.38)]

The synthesized BDMOS-PPV is completely dissolved in general organic solvent s such as chloroform, THF, cyclohexanon and xylene etc. GPC is used to determine the molecular weight, and the measured molecular weight is 14700 in a number average and 46500 in a weight-average with polydispersity index of 3.1.

BDMOS-PPV shows a maximum absorption at 436 nm and absorption edge at 510 nm. PL shows a maximum emission at 515 nm and emits light at a green region. When the absolute PL emission efficiency is measured, it shows an emission efficiency of 60%. This is much higher value than the value of PPV(25%) and MEH-PPV(15%) already published.

FIG. 1 shows a sectional view of an electorluminescent device using BDMOS-PPV as an emitting layer, showing an light-emitting device manufactured using ITO and Al which are coated on a glass as anode and cathode, respectively.

A semitransparent electrode 2 is formed on a transparent glass or a plastic substrate 1 in which ITO and Al are coated on anode and cathode, respectively, and then a hole transporting layer 3 consisted of polymers or organic materials is formed on the semitransparent electrode 2. Next, a polymer emissive layer 4 using BDMOS-PPV is formed on the hole transporting layer 3, and then an electron transporting layer 5 is formed on the polymer emissive layer 4. Finally, a metal electrode 6 is formed on the electron transporting layer 5. During this process, a well-known organic material $Alq_3$ is used as an electron transporting layer. Light emission occurs at BDMOS-PPV. At this time, when measuring current-voltage characteristic, it has been found that the amount of current flowing at same voltage is reduced more than 10 times while the quantum efficiency and the brightness of the device are greatly increased compared to those of the BDMOS-PPV single layer device. Measurement of the device manufactured as above is performed in air. Also it has been found that EL shows a similar light-emitting spectrum to PL and emits a green-color light at about 515 nm.

Thus, according to the present invention, a single layer light-emitting device (ITO/BDMOS-PPV/Al) using a coated ITO as anode, Al as cathode, and using BDMOS-PPV as an light-emitting layer, and double layer light-emitting device (ITO/BDMOS-PPV/Alq3/Al) using an electron transporting layer, can be manufactured. The manufactured two devices can emit a bright green and can be operated with it curved.

Figure 2:
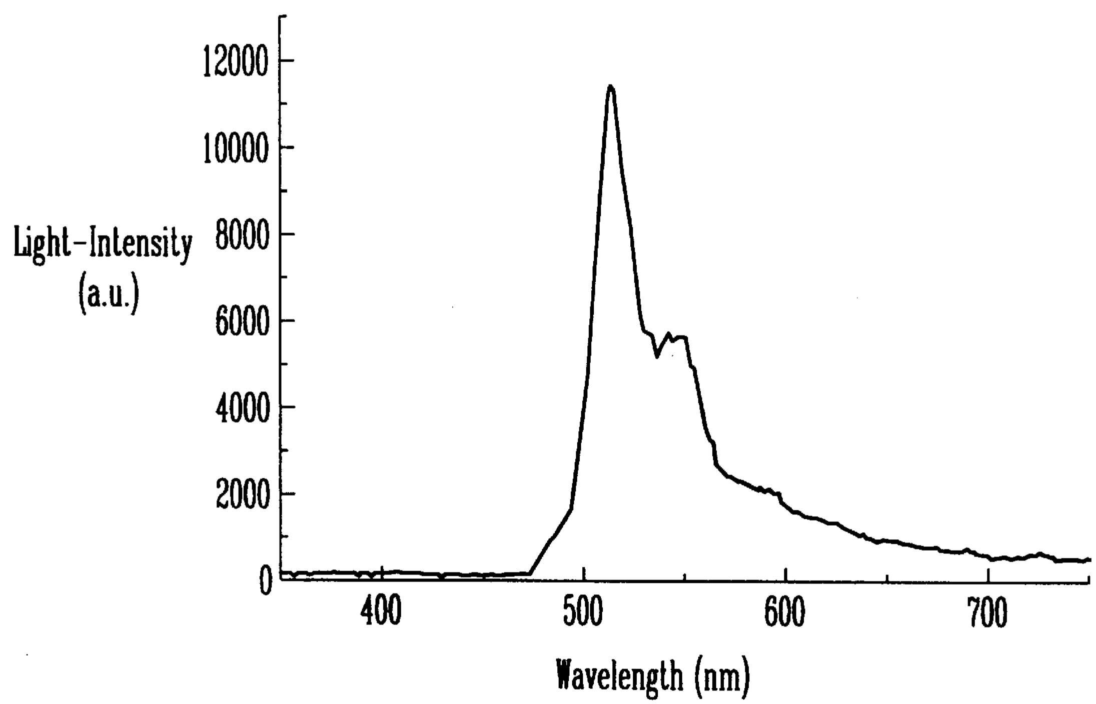
FIG. 2 is a graph illustrating an EL spectrum of a single layer EL device using BDMOS-PPV.
Figure 3:
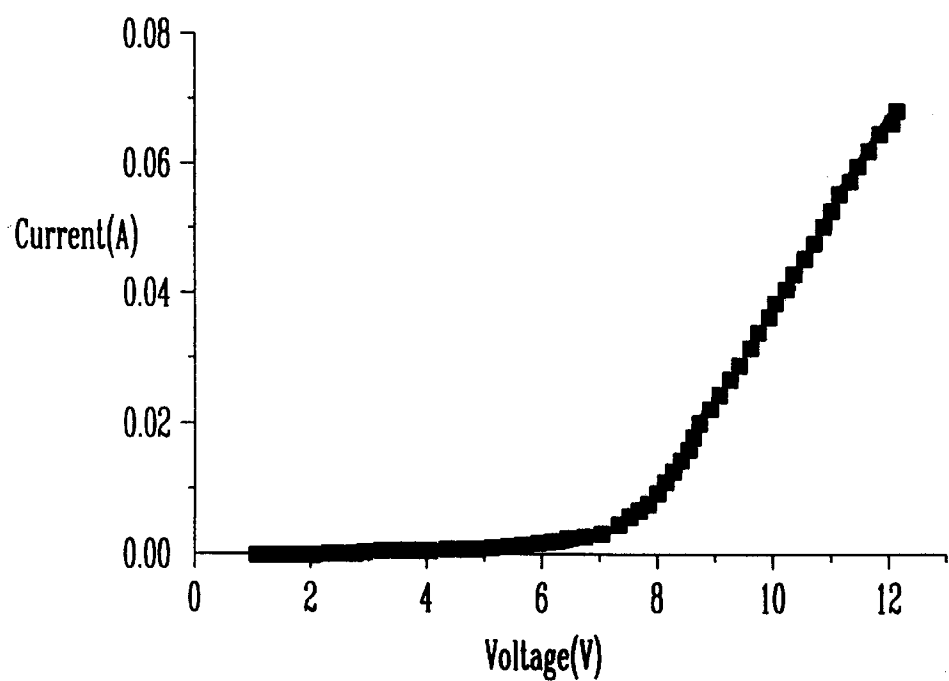
FIG. 3 is a graph illustrating a voltage-current characteristic of a single layer device using BDMOS-PPV.

FIG. 2 shows an EL spectrum of an light-emitting device using BDMOS-PPV, and FIG. 3 shows a voltage-current characteristic of the manufactured light-emitting device. The current-voltage curve shows a typical diode characteristic in which current is proportionally increased as voltage increases, and emits a bright green which is visible at about 7 V. Also, as a result of measuring the intensity of emission with the illuminometer, it shows 250 cd/m2 at 18 V.

As described above, the BDMOS-PPV of PPV inductor in which silicon is substituted according to the present invention has a much higher emission efficiency of 60% compared to that of PPV having 25% and the synthesized polymer could easily dissolve in an organic solvent. As the polymer synthesized according to the present can be obtained as a soluble form, it provides an outstanding advantage that it can manufacture an EL device on a flexible plastic substrate which does not need a high temperature elimination process and has a good processibility.

While the present invention has been described and illustrated herein with reference to the preferred embodiment thereof, it will be understood by those skilled in the art that various changes in form and details may be made therein without departing from the spirit and scope of the invention.

What is claimed is:

1. An electroluminescent device in which a semitransparent electrode, a hole transporting layer, a polymer emissive layer, an electron transporting layer and a metal electrode are sequentially formed on a substrate, wherein said polymer emissive layer is consisted of a poly[2,5-bis(dimethyloctylsilyl)-1,4-phenylenvinylene].

2. An electroluminescent device as claimed in claim 1, wherein said substrate is any one of glass or plastic.

* * * * *